(12) United States Patent
Endt

(10) Patent No.: US 6,674,284 B2
(45) Date of Patent: Jan. 6, 2004

(54) MAGNETIC RESONANCE APPARATUS HAVING A HORIZONTAL BASIC MAGNETIC FIELD

(75) Inventor: Axel Vom Endt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/256,614

(22) Filed: Sep. 27, 2002

(65) Prior Publication Data

US 2003/0057949 A1 Mar. 27, 2003

(30) Foreign Application Priority Data

Sep. 27, 2001 (DE) .......................................... 101 47 742

(51) Int. Cl.[7] ................................................. G01V 3/00
(52) U.S. Cl. ....................................... 324/318; 324/319
(58) Field of Search ................................. 324/319, 320, 324/318, 300, 306, 307, 309, 314

(56) References Cited

U.S. PATENT DOCUMENTS

| 4,829,252 | A |   | 5/1989  | Kaufman .................... 324/309 |
| 5,166,619 | A |   | 11/1992 | Ries ........................... 324/318 |
| 5,378,988 | A |   | 1/1995  | Pulyer |
| 5,414,399 | A |   | 5/1995  | Breneman et al. |
| 5,517,121 | A | * | 5/1996  | Kaufman et al. ............ 324/319 |
| 5,565,834 | A |   | 10/1996 | Hanley et al. |
| 5,708,362 | A |   | 1/1998  | Frese et al. .................. 324/319 |
| 5,760,582 | A | * | 6/1998  | Morrone ...................... 324/318 |
| 5,963,117 | A |   | 10/1999 | Ohashi et al. |
| 6,236,210 | B1 | * | 5/2001 | Takekoshi et al. .......... 324/319 |
| 6,288,546 | B1 |   | 9/2001 | Damadian et al. .......... 324/319 |

* cited by examiner

*Primary Examiner*—Louis Arana
(74) *Attorney, Agent, or Firm*—Schiff Hardin & Waite

(57) ABSTRACT

In a magnetic resonance apparatus having a magnet arrangement which generates: a basic magnetic field in a horizontal direction, an imaging volume with a central region that is freely accessible in at least one horizontal direction substantially orthogonal to the basic magnetic field, upper and lower elements that are spaced apart in a vertical direction and between which the imaging volume is disposed, and a connector element that connects the upper and the lower elements, at least one gradient coil is provided which extends at least in regions of the upper element, the lower element and the connector element.

18 Claims, 10 Drawing Sheets

MAGNETIC RESONANCE APPARATUS HAVING A HORIZONTAL BASIC MAGNETIC FIELD

BACKGROUND OF THE INVENTION

1. Field of the Invention

The invention relates to a magnetic resonance apparatus of the type having an "open" imaging volume.

2. Description of the Prior Art

The technique of magnetic resonance is a known technique for obtaining images of a body interior of an object under examination. Rapidly switched gradient fields that are produced by a gradient coil system are superimposed in a magnetic resonance apparatus on a static basic magnetic field that is produced by a basic field magnet. The magnetic resonance apparatus also has a radio-frequency system that emits radio-frequency signals into the object under examination in order to trigger magnetic resonance signals, and picks up the triggered magnetic resonance signals on the basis of which magnetic resonance images are created.

A gradient coil of the gradient coil system produces, for a specific direction in space a gradient field that has, in the ideal case, at least inside an imaging volume of the magnetic resonance apparatus, one field component which is collinear with the basic magnetic field. The field component has in this case a prescribable gradient that is approximately of the same magnitude at any desired instant, at least inside the imaging volume, in a fashion dependent on location. Since the gradient field is a temporally variable magnetic field, although the above is true for any instant, the strength of the gradient is variable from one instant to another instant. The direction of the gradient is generally permanently prescribed by the design of the gradient coil. Appropriate currents are created in the gradient coil in order to produce the gradient field. The amplitudes of the required currents are several 100 A. The rates of current rise and fall are several 100 kA/s. The gradient coils are connected to gradient amplifiers for the purpose of power supply.

A magnetic resonance machine with a C-shaped basic field magnet for producing a vertically directed basic magnetic field is known, for example, from German OS 40 37 894. The basic field magnet has two pole shoes between which an imaging volume of the magnetic resonance machine is arranged. In this case, access to the imaging volume in the horizontal direction is limited only by a yoke of the basic field magnet, and so the imaging volume is freely accessible in an angular range of approximately 270° with reference to a midpoint of the imaging volume. As a result of which the magnetic resonance machine is particularly suitable, owing to its open design, both for interoperative and intraoperative use and for examining patients with claustrophobia. In this arrangement, gradient coils designed as flat coils are laid in recesses in the pole plates in order to produce gradient fields.

Also known, for example from U.S. Pat. No. 4,829,252, is a magnetic resonance apparatus having a horizontally preceding basic magnetic field, with a basic field magnet essentially formed by two pole plates that extend in the vertical direction and that are spaced apart in the horizontal direction, and which are interconnected by four horizontally proceeding columns. An imaging volume situated at the center of the basic field magnet is accessible in the horizontal direction only from the two sides that are not blocked by the pole plates. The gradient coils are designed, in turn, as flat coils and are fastened on the sides of the pole plates, which face the imaging volume.

Also known from the above-named U.S. Pat. No. 4,829,252 is a magnetic resonance apparatus in which an imaging volume is arranged in a tunnel-like examination space such that the imaging volume is accessible only from the two tunnel openings. Here, the tunnel-like examination space is formed substantially by a hollow cylindrical, generally superconducting basic field magnet having a cavity in which a likewise hollow cylindrical gradient coil system is arranged. The basic field magnet produces a horizontally directed basic magnetic field in the examination space.

SUMMARY OF THE INVENTION

An object of the present invention is to create a highly efficient gradient coil system for a so-called open magnetic resonance apparatus having a basic magnetic field in the horizontal direction.

The object is achieved according to the invention in a magnetic resonance apparatus having a magnet arrangement which generates a basic magnetic field in a horizontal direction, an imaging volume with central region that is freely accessible in at least one horizontal direction substantially orthogonal to the basic magnetic field, upper and lower elements that are spaced apart in a vertical direction and between which the imaging volume is disposed, a connector element that connects the upper and the lower elements, and at least one gradient coil, which extends at least in subregions of the upper element, the lower element and the connector element.

Owing to the higher efficiency of the gradient coil composed to a comparable gradient coil of the type known in the prior art in which, in particular, the connector element is not used, advantages result with respect to the inductance of the gradient coil, the required installation volume, behavior in terms of waste heat and noise, and behavior of the gradient coil as an eddy current generator.

DESCRIPTION OF THE PREFERRED EMBODIMENTS

Figure 1:
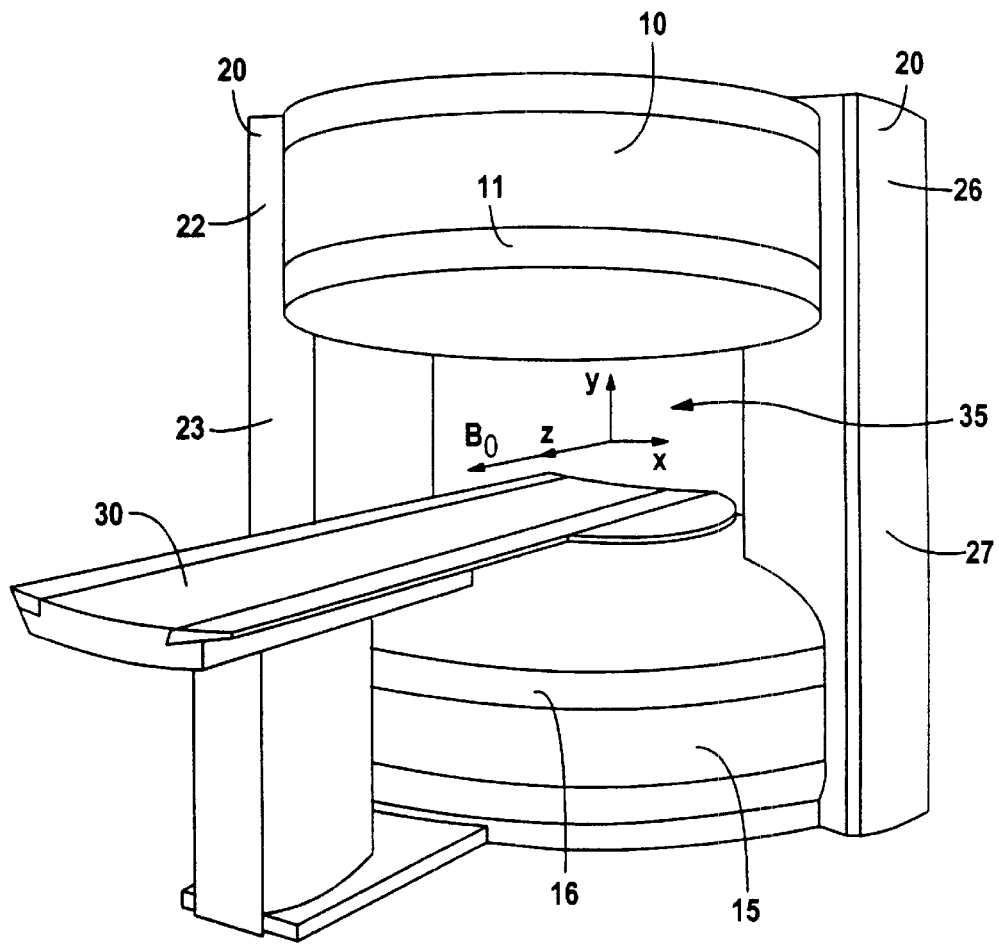
FIG. 1 is a perspective view of a magnetic resonance machine having two columns, in accordance with the invention.

FIG. 1 is a perspective view of a magnetic resonance apparatus as an exemplary embodiment of the invention. The magnetic resonance apparatus has a substantially cylindrical upper element 10 and a likewise substantially cylindrical lower element 15 that are interconnected by a first column 22 and a second column 26. The magnetic resonance apparatus also has a support device 30 that can be used to position in an imaging volume 35 of the magnetic resonance apparatus, a region to be imaged of an object under examination that is disposed on the support device 30. The imaging volume 35 extends around a center between the upper and lower elements 10 and 15.

The magnetic resonance apparatus has a basic field magnet for producing a static basic magnetic field $B_0$ that proceeds in the horizontal direction and is as homogeneous as possible inside the imaging volume 35. Parts of the basic field magnet are arranged at least in the upper and lower elements 10 and 15 of the magnetic resonance apparatus.

The magnetic resonance apparatus has a gradient coil system allowing rapidly switchable magnetic gradient fields to be produced that are as linear as possible inside the imaging volume 35. The gradient coil system has at least an x-gradient coil for producing a magnetic gradient field with a gradient in the x direction, a y-gradient coil for producing a magnetic gradient field with a gradient in the y direction, and a z-gradient coil for producing a magnetic gradient field with a gradient in the z direction.

Figure 2:
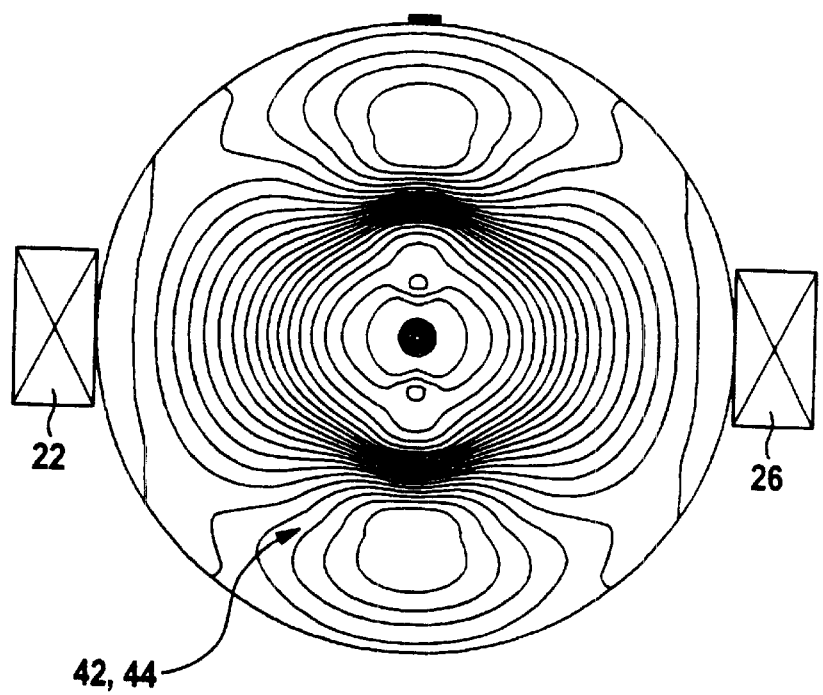
FIG. 2 shows the basic layout of a conductor arrangement for a coil section of a z-gradient coil of the magnetic resonance apparatus of FIG. 1 in accordance with the invention.

The z-gradient coil shown in FIG. 2 in this case is formed essentially by two identically constructed disk-shaped coil sections 42 and 44. One of the coil sections 42 and 44 is arranged in an upper disk-shaped region 11 of the upper element 10, and the other one of the coil sections 42 and 44 is arranged in a lower disk-shaped region 16 of the lower element 15. The coil sections 42 and 44 are mirror images of one another with reference to the x-z plane. During operation of the gradient coil system, the coil section 42 or 44 arranged in the upper region 11 has current flowing therein in a direction opposite to the direction the coil section 44 or 42 arranged in the lower region 16.

FIG. 2 shows the basic layout of a conductor arrangement for the coil sections 42 and 44 of the z-gradient coil as an exemplary embodiment of the invention. The columns 22 and 26 sectioned parallel to the x-z plane also are illustrated in FIG. 2 to assist orientation relative to the perspectively illustrated magnetic resonance apparatus in FIG. 1.

Figure 3:
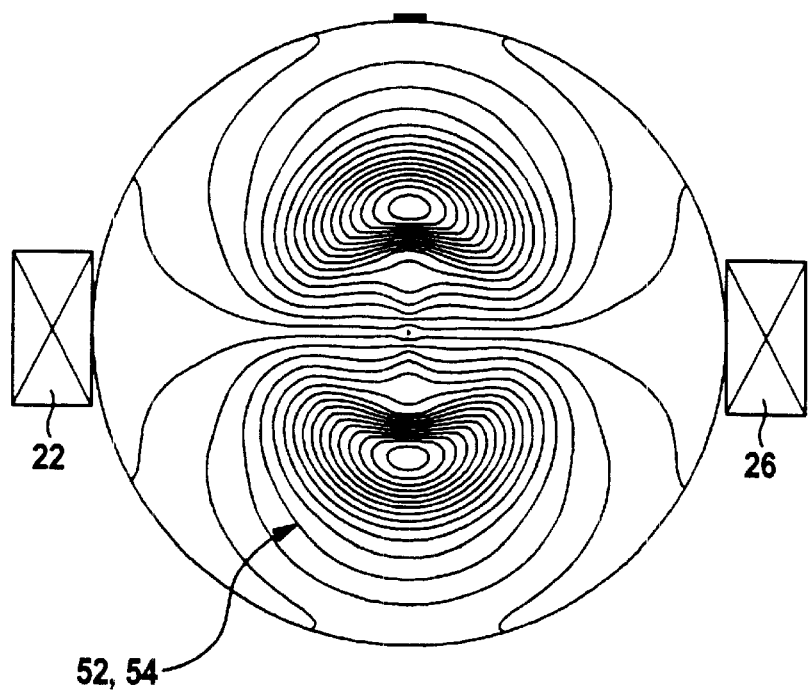
FIG. 3 shows the basic layout of a conductor arrangement for a coil section of a y-gradient coil of the magnetic resonance apparatus of FIG. 1, in accordance with the invention.

The y-gradient coil of the gradient coil system shown in FIG. 3 is formed essentially by two identically constructed disk-shaped coil sections 52 and 54. One of the coil sections 52 and 54 is arranged in the upper region 11, and the other one of the coil sections 52 and 54 is arranged in the lower region 16. The coil sections 52 and 54 are mirror images of one another with reference to the x-z plane. During operation of the gradient coil system, the coil section 52 or 54 arranged in the upper region 11 has current flowing therein in a direction opposite to the direction of current flow in the coil section 54 or 52 arranged in the lower region 16.

FIG. 3 shows the basic layout of a conductor arrangement for the coil sections 52 and 54 of the y-gradient coil as an exemplary embodiment of the invention. The columns 22 and 26 sectioned parallel to the x-z plane also are illustrated in FIG. 3 to assist orientation relative to the perspectively illustrated magnetic resonance apparatus in FIG. 1.

Figure 4:
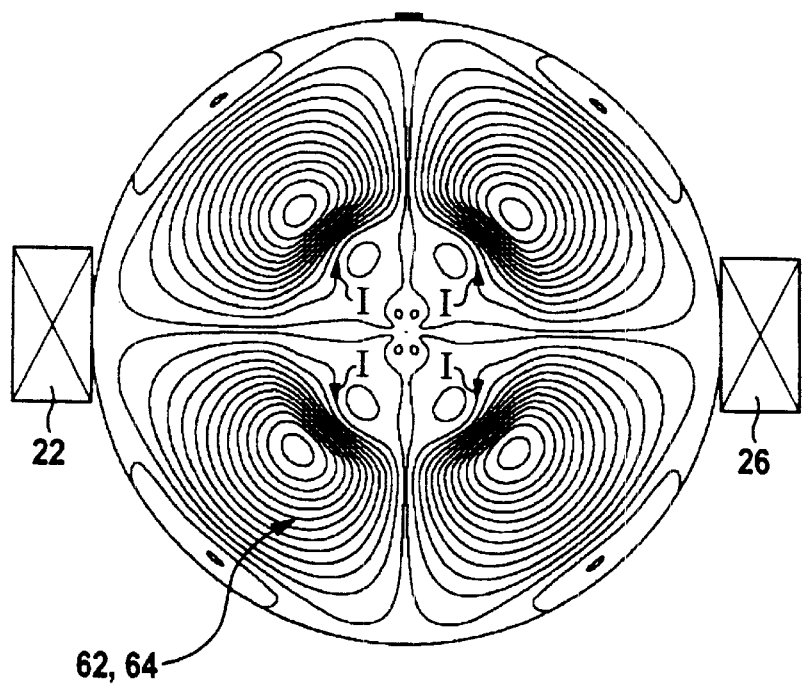
FIG. 4 shows the basic layout of a conductor arrangement for a disk-shaped coil section of an x-gradient coil of the magnetic resonance apparatus of FIG. 1, in accordance with the invention.

The x-gradient coil of the gradient coil system shown in FIG. 4 is formed essentially by four coil sections, respectively arranged in the upper region 11, the lower region 16, a first region 23 of the first column 22, and a second region 27 of the second column 26.

The x-gradient coil is formed by two substantially identically constructed disk-shaped coil sections 62 and 64, one of the coil sections 62 and 64 being arranged in the upper region 11, and the other one of the coil sections 62 and 64 being arranged in the lower region 16. The coil sections 62 and 64 are mirror images of one another with reference to the x-z plane. During operation of the gradient coil system, the coil section 62 or 64 arranged in the upper region 11 has current flowing therein in a direction opposite to the direction of current flow in the coil section 64 or 62 arranged in the lower region 16.

FIG. 4 shows the basic layout of a conductor arrangement for the disk-shaped coil sections 62 and 64 of the x-gradient coil as an exemplary embodiment of the invention. The columns 22 and 26 sectioned parallel to the x-z plane also are illustrated in FIG. 4 to assist orientation relative to the perspectively illustrated magnetic resonance apparatus in FIG. 1. For the coil section 62 or 64 arranged in the upper region 11 a directional distribution, illustrated with arrows, of a current I taken as positive is depicted in FIG. 4. A directional distribution of the current I that is directed in the opposite direction exists for the coil section 64 or 62 arranged in the lower region 16.

The x-gradient coil additionally has the further two, substantially identically constructed coil sections, one of the coil sections being arranged in the first region 23, and the other one of the coil sections being arranged in the second region 27. The coil sections arranged in the regions 23 or 27 of the columns 22 and 26 are constructed to be mirror images of one another with reference to a y-z plane. In contrast to the case of the disk-shaped coil sections 42 to 64, the mirror imaging mentioned above in the case of the coil sections arranged in the columns 22 and 26 also is valid with regard to the distribution of current direction.

Figure 5:
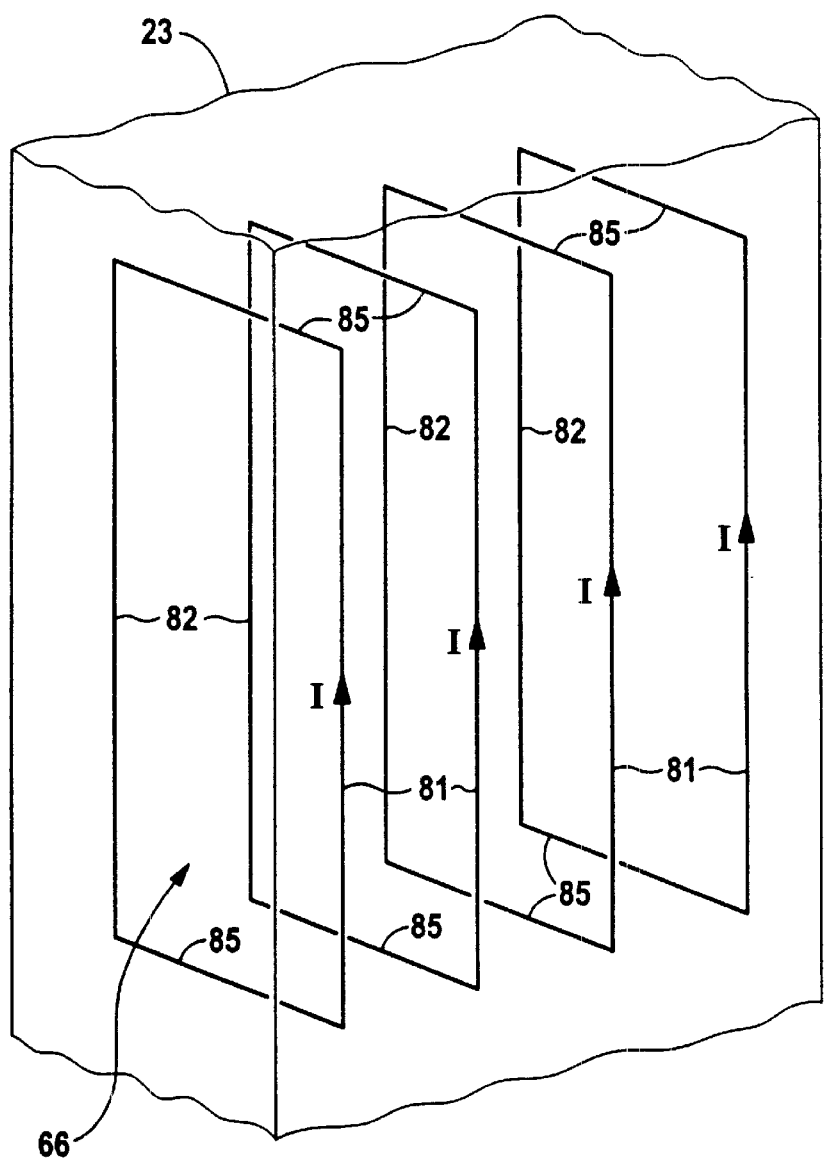
FIG. 5 shows substantially illustrates a conductor arrangement for a coil section, arranged in one of the columns, for the x-gradient coil of the magnetic resonance apparatus of FIG. 1, in accordance with the invention.

FIG. 5 shows the principle of a conductor arrangement for the coil section 66 of the x-gradient coil arranged in the first region 23 of the first column 22 as an exemplary embodiment of the invention. The course of the conductors includes vertical conductor sections 81 and 82 on a side of the first region 23 facing the imaging volume 35, and on a side of the first region 23 averted from the imaging volume 35. The vertical conductor sections 81 and 82 are connected by horizontal conductor sections 85. In coordination with the current direction fixed in FIG. 4, the coil section 66, illustrated in FIG. 5, for the current I has a direction proceeding from bottom to top for the conductor sections 81, which is illustrated by arrows.

In other embodiments, the vertical conductor sections 81 are closed on paths other than those illustrated in FIG. 5. For this purpose, for example, it is also possible for conductor sections to proceed on the two lateral surfaces, not used in FIG. 5, of the first column 22 and/or in the upper and/or lower element 10 and/or 15.

The description in relation to FIG. 5 applies as well for the coil section (not illustrated), of the x-gradient coil, arranged in the second region 27 of the second pillar 26.

Figure 6:
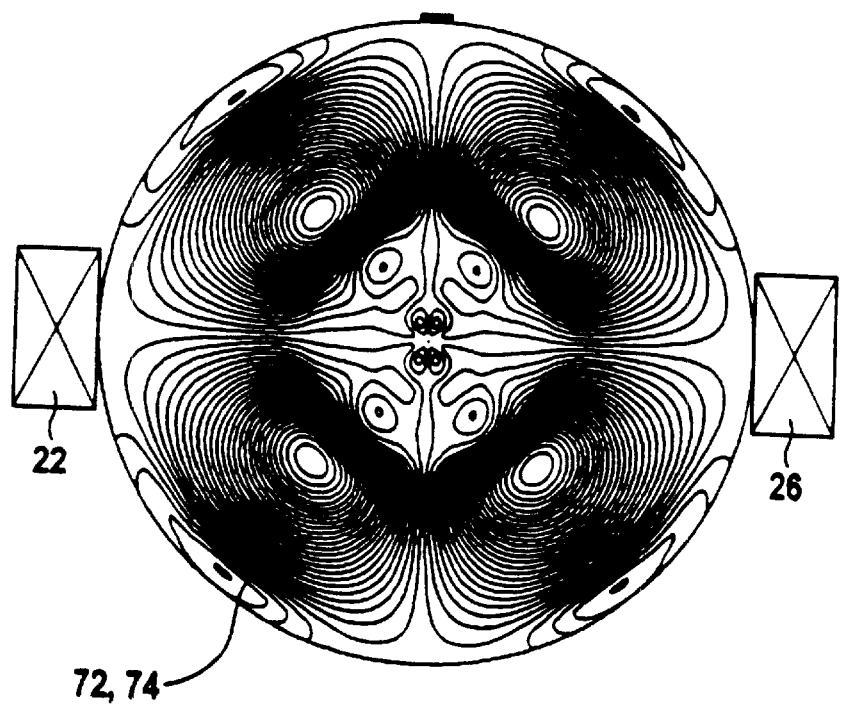
FIG. 6 shows, for comparison purposes, the basic layout of a conductor arrangement for a coil section of an x-gradient coil in accordance with the prior art.

An x-gradient coil in accordance with the prior art shown in FIG. 6 essentially formed by two identically constructed disk-shaped coil sections 72 and 74 that would be arranged in the upper and lower regions 11 and 16, as mirror images of one another with reference to the x☐z plane. FIG. 6 shows for comparison purposes the basic layout of a conductor arrangement for the coil sections 72 and 74 of the x-gradient coil in accordance with the prior art. The columns 22 and 26 sectioned parallel to the x-z plane also are illustrated in FIG. 6 to assist orientation relative to the perspectively illustrated magnetic resonance apparatus in FIG. 1. By contrast with the coil sections 72 and 74 according to the prior art illustrated in FIG. 6, the coil sections 62 and 64 of FIG. 4, which belong to the x-gradient coil, which is exemplary for the invention, with coil sections in the pillars 22 and 26, have a substantially lower conductor density and inductance. This is advantageous, inter alia, with regard to a required installation volume, waste heat behavior and eddy current induction for example in the basic field magnet.

It also should be noted that the x-gradient coil in accordance with the prior art is less efficient by a factor of approximately five by comparison with the y☐gradient coil and the z-gradient coil. This disproportion is cancelled in the case of the inventive x☐gradient coil, having the coil sections in the columns 22 and 26.

FIGS. 7 to 10 show coil sections 42s to 66s of shielding coils, belonging to the gradient coils, for forming an actively shielded gradient coil system as further exemplary embodiments of the invention.

Figure 7:
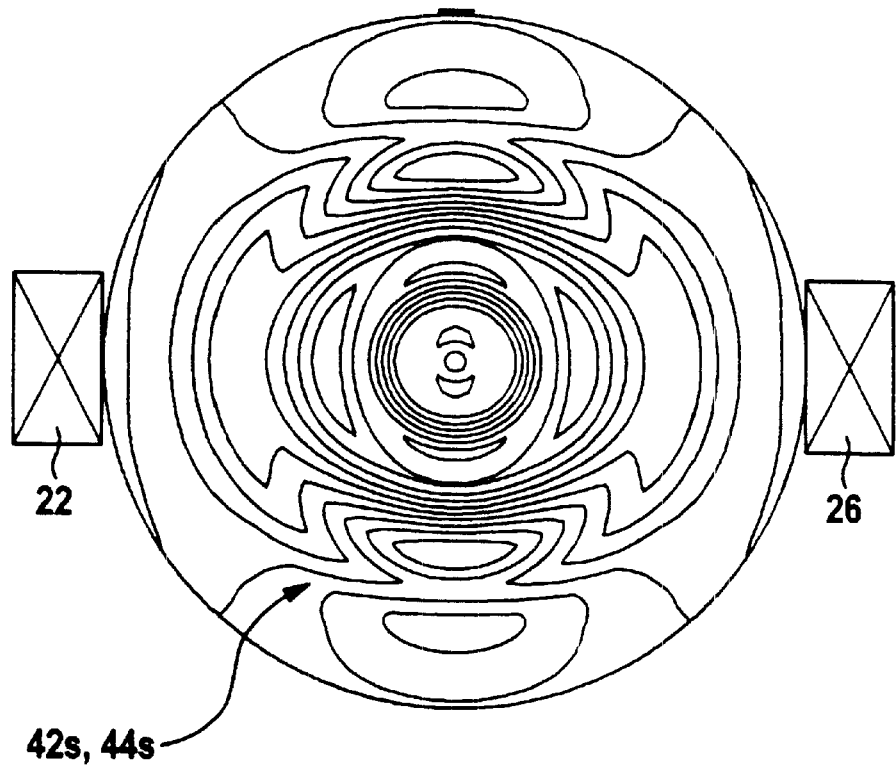
FIG. 7 shows the basic layout of a conductor arrangement for a coil section of a z-shielding coil of the magnetic resonance apparatus of FIG. 1, in accordance with the invention.

As shown in FIG. 7, a z-shielding coil belonging to the z-gradient coil is formed essentially by two identically constructed disk-shaped coil sections 42s and 44s, one of the coil sections 42s and 44s being arranged in the upper region 11 and the other one of the coil sections 42s and 44s being arranged in the lower region 16. By comparison with the associated coil sections 42 and 44 of the z☐gradient coil, the coil sections 42s and 44s of the z-shielding coil are arranged further outside in the regions 11 and 16 with reference to the imaging volume 35 and have a lower conductor density. During operation of the gradient coil system, here the coil sections 42s and 44s are energized in the opposite sense with regard to the coil section 42 or 44 arranged in the same region 11 or 16. FIG. 7 shows for this purpose the basic layout of a conductor arrangement for the coil sections 42s and 44s of the z-shielding coil. The columns 22 and 26 sectioned parallel to the x-z plane also are illustrated in FIG. 7 to assist orientation relative to the perspectively illustrated magnetic resonance machine in FIG. 1.

Figure 8:
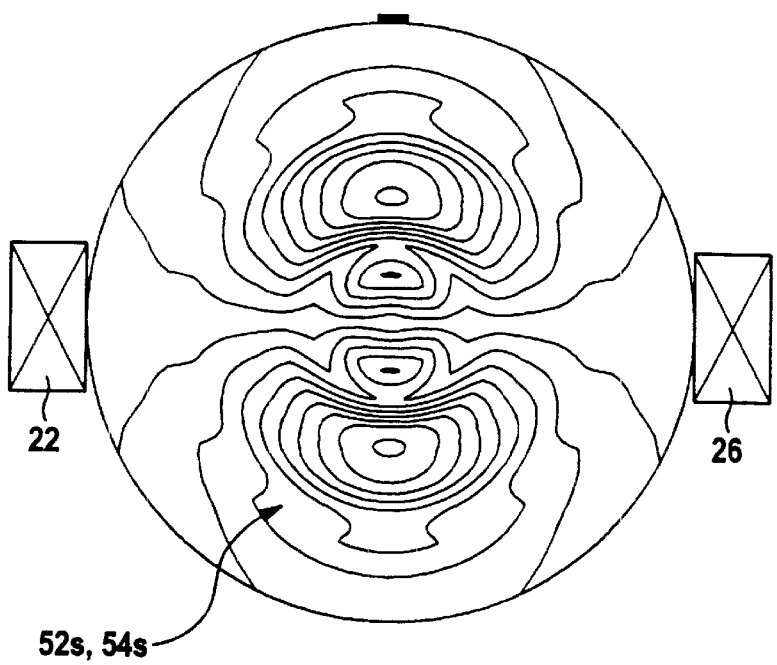
FIG. 8 shows the basic layout of a conductor arrangement for a coil section of a y-shielding coil of the magnetic resonance apparatus of FIG. 1, in accordance with the invention.

As shown in FIG. 8, y-shielding coil belonging to the y-gradient coil is formed essentially by two identically constructed disk-shaped coil sections 52s and 54s, one of the coil sections 52s and 54s being arranged in the upper region 11 and the other one of the coil sections 52s and 54s being arranged in the lower region 16. By comparison with the associated coil sections 52 and 54 of the x-gradient coil, the coil sections 52s and 54s of the y-shielding coil are arranged further outside in the regions 11 and 16 with reference to the imaging volume 35 and have a lower conductor density. During operation of the gradient coil system, the coil sections 52s and 54s are energized in the opposite sense with regard to the coil section 52 or 54 arranged in the same region 11 or 16. FIG. 8 shows for this purpose the basic layout of a conductor arrangement for the coil sections 52s and 54s of the y-shielding coil. The columns 22 and 26 sectioned parallel to the x-z plane are also illustrated in FIG. 8 to assist orientation relative to the perspectively illustrated magnetic resonance machine in FIG. 1.

Figure 9:
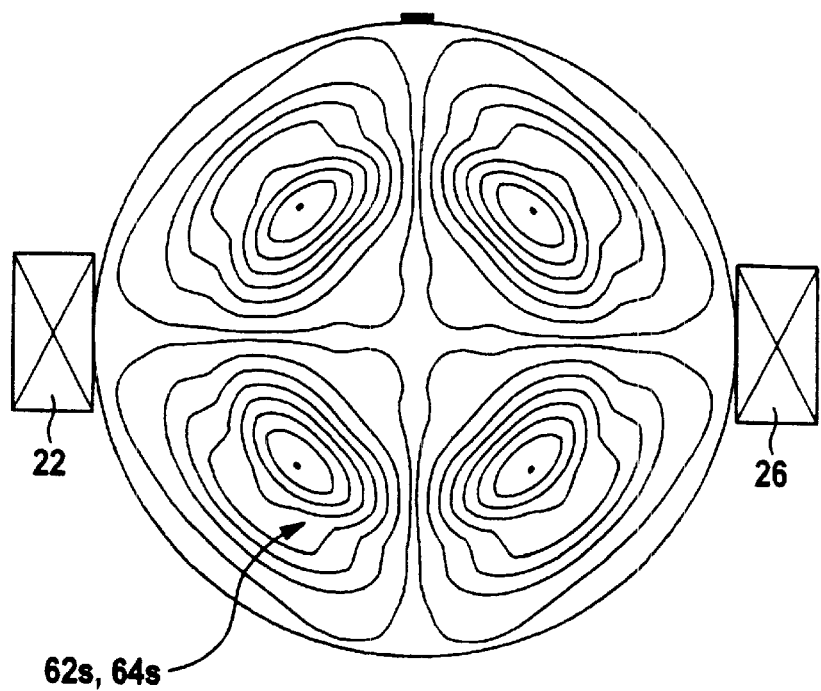
FIG. 9 shows the basic layout of a conductor arrangement for a disk-shaped coil section of an x-shielding coil of the magnetic resonance apparatus of FIG. 1, in accordance with the invention.

As shown in FIG. 9 an x-shielding coil, belonging to the x-gradient coil, of the gradient coil system, like the x-gradient coil is formed by four coil sections, respectively arranged in the upper region 11, the lower region 16, the first region 23 and the second region 27.

The x-shielding coil has two substantially identically constructed disk-shaped coil sections 62s to 64s, one of the coil sections 62s and 64s being arranged in the upper region 11, the other one of the coil sections 62s and 64s being arranged in the lower region 16. By comparison with the associated coil sections 62 and 64 of the x-gradient coil, the coil sections 62s and 64s of the x-shielding coil are arranged further outside in the regions 11 and 16 with reference to the imaging volume 35 and have a lower conductor density. During operation of the gradient coil system, the coil sections 62s and 64s are energized in the opposite sense with regard to the coil section 62 or 64 arranged in the same region 11 or 16. FIG. 9 shows for this purpose the basic layout of a conductor arrangement for the coil sections 62s and 64s of the x-shielding coil. The columns 22 and 26 sectioned parallel to the x-z plane also are illustrated in FIG. 9 to assist orientation relative to the perspectively illustrated magnetic resonance machine in FIG. 1.

Figure 10:
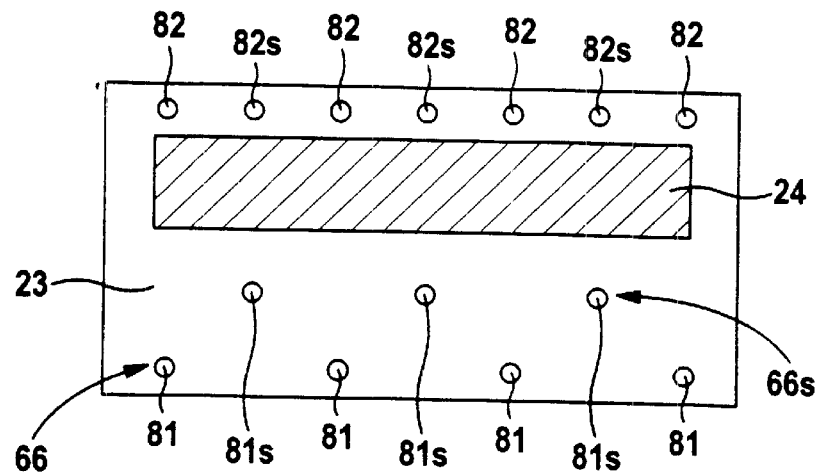
FIG. 10 illustrates a conductor arrangement for a coil section, arranged in one of the pillars, of the x-shielding coil of the magnetic resonance apparatus of FIG. 1, in accordance with the invention.

The x-shielding coil also includes the further two substantially identically constructed coil sections, one of these coil sections being arranged in the first region 23, and the other of these coil sections being arranged in the second region 27. FIG. 10 shows for this purpose a horizontal cross section through the first region 23 of the column 22. The coil section 66s, arranged in the region 23, of the x-shielding coil has vertical conductor sections 81s and 82s that are connected in a fashion similar to the conductor sections 81 and 82 of the associated coil section 66 of the x-gradient coil. During operation of the gradient coil system, the conductor sections 81s have current flowing therein in a direction opposite to the direction of current flow in associated conductor sections 81, and the current flow in the conductor sections 82s is opposite to the direction in the associated conductor sections 82. Also illustrated in FIG. 10 is an electrically conductive region 24, for example made from a metal, in which currents flowing in the coil section 66 produce eddy currents that are undesired. The coil section 66s of the x-shielding coil is constructed so that the previously mentioned eddy currents are minimized in the region 24, in particular with regard to their effect on the imaging volume 35.

Figure 11:
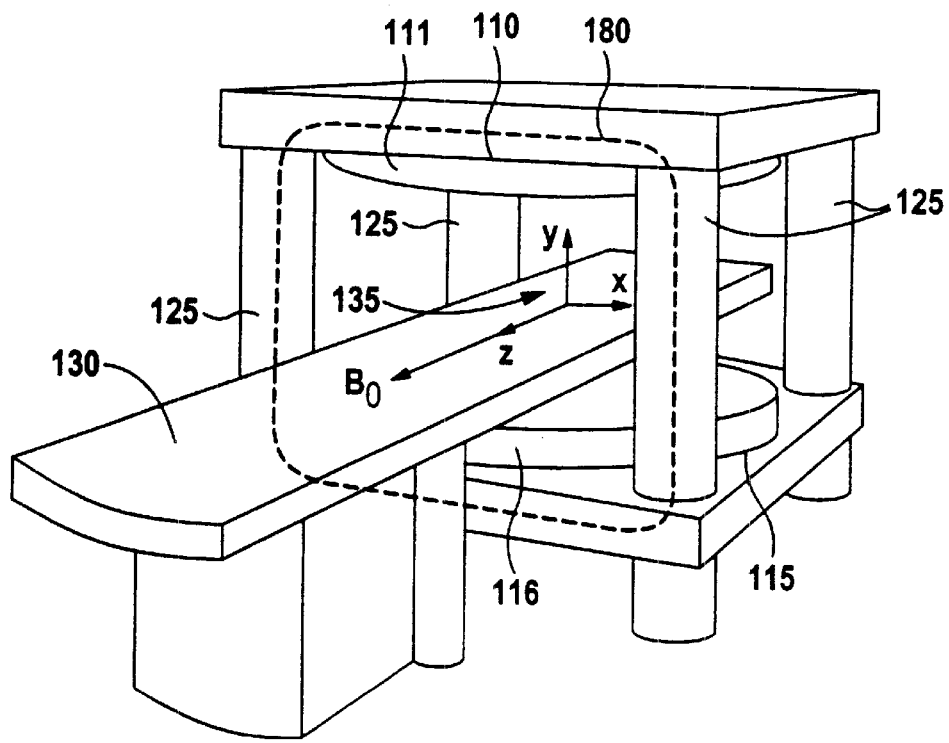
FIG. 11 is a perspective view of a magnetic resonance machine having four columns in accordance with the invention.

FIG. 11 shows a perspective view of a magnetic resonance apparatus having four columns 125 as a further exemplary embodiment of the invention. This magnetic resonance apparatus has an upper element 110 and a lower element 115 that are interconnected via a connector element that substantially comprises four pillars 125. The magnetic resonance apparatus of FIG. 11 also has a bearing device 130 that can be used to position in an imaging volume 135 of the magnetic resonance apparatus a region to be imaged of an object under examination mounted on the support device 130. The imaging volume 135 extends around a center between the upper and lower elements 110 and 115.

The magnetic resonance apparatus of FIG. 11 has a basic field magnet for producing a static basic magnetic field $B_0$ which proceeds in the horizontal direction and is as homogeneous as possible inside the imaging volume 135. Parts of the basic field magnet are arranged at least in the upper and lower elements 110 and 115 of the magnetic resonance apparatus.

The upper element 110 in this case has an upper disk-shaped region 111, and the lower element 115 comprises a lower disk-shaped region 116, coil sections of a gradient coil system being arranged in the disk-shaped regions 111 and 116. A y-gradient coil is constructed to have two disk-shaped coil sections in a way corresponding to the description relating to FIG. 2. Furthermore, the gradient coil system has an x-gradient coil formed essentially by two disk-shaped coil sections, which are constructed and arranged in accordance with the description relating to FIG. 4, and four further coil sections that are constructed in a way similar to the description relating to FIG. 5, respectively arranged in the columns 125.

The gradient coil system also has a z-gradient coil that has, inter alia, conductor sections that are arranged like rings inside the upper element 110, the lower element 115 and two columns 125 positioned identically in the z-direction. One of the conductor sections 180 is indicated in FIG. 11 by a dashed line. The advantages described in conjunction with FIG. 6 result for such a z-gradient coil by comparison with a z-gradient coil that is formed by two disk-shaped coil sections arranged in the upper and in the lower regions 111 and 116.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a magnet arrangement which generates a basic magnetic field in a horizontal direction;
   an upper element and a lower element spaced from each other in a vertical direction;
   a connector element connecting said upper element and said lower element;
   an imaging volume disposed between said upper element and said lower element and having a central region accessible at least in one horizontal direction substantially orthogonal to said horizontal direction of said basic magnetic field; and
   at least one gradient coil extending at least in regions of said upper element, said lower element and said connector element.

2. A magnetic resonance apparatus as claimed in claim 1 wherein a portion of said gradient coil disposed in said connector element has conductor sections proceeding in a vertical direction.

3. A magnetic resonance apparatus as claimed in claim 1 wherein said gradient coil comprises at least one first coil section disposed in one of said upper element and said lower element, and a second coil section disposed in the other of said upper element and said lower element.

4. A magnetic resonance apparatus as claimed in claim 1 wherein said gradient coil comprises at least one conductor section forming a ring and disposed in said upper element, said lower element and said connector element.

5. A magnetic resonance apparatus as claimed in claim 1 wherein said gradient coil has a coil structure which produces a gradient field with a horizontal gradient directed orthongonly to said horizontal direction of said basic magnetic field.

6. A magnetic resonance apparatus as claimed in claim 1 wherein said gradient coil has a gradient coil structure which produces a gradient field with a gradient inset horizontal direction of said basic magnetic field.

7. A magnetic resonance apparatus as claimed in claim 1 comprising a further gradient coil disposed in said upper element and said lower element.

8. A magnetic resonance apparatus as claimed in claim 7 wherein said further gradient coil has a coil structure which produces a gradient field with a gradient in a vertical direction.

9. A magnetic resonance apparatus as claimed in claim 7 wherein said further gradient coil has a coil structure which produces a gradient in the horizontal direction of said basic magnetic field.

10. A magnetic resonance apparatus as claimed in claim 7 further comprising a shielding coil having a coil structure and a coil position for shielding said gradient coil.

11. A magnetic resonance apparatus as claimed in claim 10 further comprising a further shielding coil having a coil structure and a coil position for shielding said further gradient coil.

12. A magnetic resonance apparatus as claimed in claim 1 further comprising a shielding coil having a coil structure and a coil position for shielding said gradient coil.

13. A magnetic resonance apparatus as claimed in claim 12 wherein said shielding coil is disposed at least in sub regions of said connector element.

14. A magnetic resonance apparatus as claimed in claim 1 wherein said upper element has a shape selected from the group consisting of disks and plates.

15. A magnetic resonance apparatus as claimed in claim 1 wherein said lower element has a shape selected from the group consisting of disks and plates.

16. A magnetic resonance apparatus as claimed in claim 1 wherein each of said upper element and said lower element has a shape selected from the group consisting of disks and plates.

17. A magnetic resonance apparatus as claimed in claim 1 wherein said connector element comprises a plurality of columns.

18. A magnetic resonance apparatus as claimed in claim 17 wherein said plurality is in a range from two to four.

\* \* \* \* \*